United States Patent
Shima et al.

(10) Patent No.: US 7,989,330 B2
(45) Date of Patent: Aug. 2, 2011

(54) DRY ETCHING METHOD

(75) Inventors: Takeshi Shima, Kudamatsu (JP);
Kenichi Kuwabara, Hikari (JP);
Tomoyoshi Ichimaru, Kudamatsu (JP);
Kenji Imamoto, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 168 days.

(21) Appl. No.: 12/512,103

(22) Filed: Jul. 30, 2009

(65) Prior Publication Data
US 2010/0285669 A1 Nov. 11, 2010

(30) Foreign Application Priority Data

May 11, 2009 (JP) .................... 2009-114109

(51) Int. Cl.
*H01L 21/20* (2006.01)

(52) U.S. Cl. ........ 438/584; 438/485; 438/586; 438/587; 438/652; 438/656; 438/657; 438/689; 438/694; 438/696

(58) Field of Classification Search .............. None
See application file for complete search history.

(56) References Cited

U.S. PATENT DOCUMENTS

| | | | | |
|---|---|---|---|---|
| 5,767,018 | A * | 6/1998 | Bell ............... | 438/696 |
| 6,955,964 | B2 * | 10/2005 | Haselden et al. ..... | 438/257 |
| 2004/0209468 | A1 | 10/2004 | Kummar et al. | |
| 2005/0095783 | A1 * | 5/2005 | Haselden et al. ..... | 438/257 |

FOREIGN PATENT DOCUMENTS

| | | |
|---|---|---|
| JP | 8-31801 | 2/1996 |
| JP | 2007-250940 | 9/2007 |
| JP | 2008-502141 | 1/2008 |
| KR | 10-2004-0090931 | 10/2004 |

OTHER PUBLICATIONS

Korean Official Action dated Feb. 22, 2011, for KR Application No. 2009-69302.

* cited by examiner

*Primary Examiner* — Duy-Vu N Deo
(74) *Attorney, Agent, or Firm* — Antonelli, Terry, Stout & Kraus, LLP.

(57) ABSTRACT

After etching a polysilicon film, when a protective film made of a carbon polymer is formed on a sidewall of the polysilicon film using plasma containing carbons, a metallic material as a lower film is etched using plasma containing a halogen gas under an etching condition in which volatility is improved due to the rise in a wafer temperature or the low pressure of a processing pressure, thereby preventing a side etching and unevenness of a sidewall of the polysilicon film. Further, by using the protective film made of a carbon polymer, metallic substances scattered at the time of etching the metallic material are not directly attached to the polysilicon film, but can be simply removed along with the protective film made of a carbon polymer in an asking step.

4 Claims, 3 Drawing Sheets

DRY ETCHING METHOD

INCORPORATION BY REFERENCE

The present application claims priority from Japanese application JP2009-114109 filed on May 11, 2009, the content of which is hereby incorporated by reference into this application.

BACKGROUND OF THE INVENTION

The present invention relates to a method of manufacturing a semiconductor device, and more particularly, to dry etching techniques of a metal gate electrode.

A silicon oxide film-based film such as a $SiO_2$ film and a SiON film has been used for a long time as a gate insulation film of a semiconductor element. However, from requests of micro-processing rate of patterns and speeding up of an operation speed of semiconductor devices, thinning of a gate insulation film progresses and these gate insulation films reach the limit of thinning in recent years. To cope with the above-described problem, high dielectric such as HfSiO and $HfO_2$, which can reduce a thickness of $SiO_2$ gate oxide film having the same thickness to one part in several in terms of an equivalent gate insulation film thickness, is being used as alternate materials.

However, there occurs a problem that when the above-described high dielectric films are simply used as a gate insulation film in place of a previous gate oxide film, transistor characteristics are lowered, due to depletion of a polysilicon film, in an interface between the gate insulation film and polysilicon film of the gate electrode. However, this phenomenon is avoidable by sandwiching a metallic layer between the high dielectric gate oxide film and the polysilicon film, and the above-described metal/high dielectric gate structure is actually adopted as a gate structure for the next generation. A known example related to the technique includes, for example, JP-T-2008-502141 (the term "JP-T" as used herein means a published Japanese translation of a PCT application) (corresponding to U.S. Pat. No. 7,163,880).

For purpose of generally etching a metallic material, a gas (hereinafter, referred to as a halogen gas) composed of a halogen simple substance or halides is used. Further, since reaction products generated between the above-described etching gases and the metallic material have low volatility, the etching is hard to progress. Therefore, for processing a metallic material, the etching is required to be allowed to progress while improving volatility of the reaction product due to the rise in a wafer temperature or the low pressure of a processing pressure.

Further, JP-A-2007-250940 (corresponding to U.S. Patent Publication No. 2007/218696) discloses a technology for suppressing a side-etching shape generated by the etching processing, using reaction products generated by an addition gas (hydrocarbon), after main etching of the polysilicon film.

SUMMARY OF THE INVENTION

However, in a conventional technology disclosed in JP-T-2008-502141, there is the following problem. That is, when a metallic material is etched under a condition in which volatility is improved, a reaction with a previously processed polysilicon film is also accelerated, and therefore, side etching or unevenness of a sidewall occurs on the polysilicon film.

Further, there is a problem that metallic substances scattered at the time of etching the metallic material are attached to the sidewall of the polysilicon film again, and finally remain as residues.

Further, in a conventional technology disclosed in JP-A-2007-250940, there is a problem that a protective film made of a carbon polymer for protecting the sidewall of the etched polysilicon film fails to be formed.

To accomplish the above object, according to the present invention, after etching a polysilicon film, when a protective film made of a carbon polymer is formed on a sidewall of the polysilicon film using plasma containing carbons, a metallic material as a lower film is etched using plasma containing a halogen gas, thereby preventing a side etching and unevenness of a sidewall of the polysilicon film.

There can be provided a dry etching method that by using the protective film made of a carbon polymer, metallic substances scattered at the time of etching the metallic material are not directly attached to the polysilicon film, but can be simply removed along with the protective film made of a carbon polymer in an asking step.

DESCRIPTION OF THE EMBODIMENTS

The embodiments of the present invention will be described in detail below with reference to the attached drawings. The present example is performed using an ECR etching device.

Figure 1A:
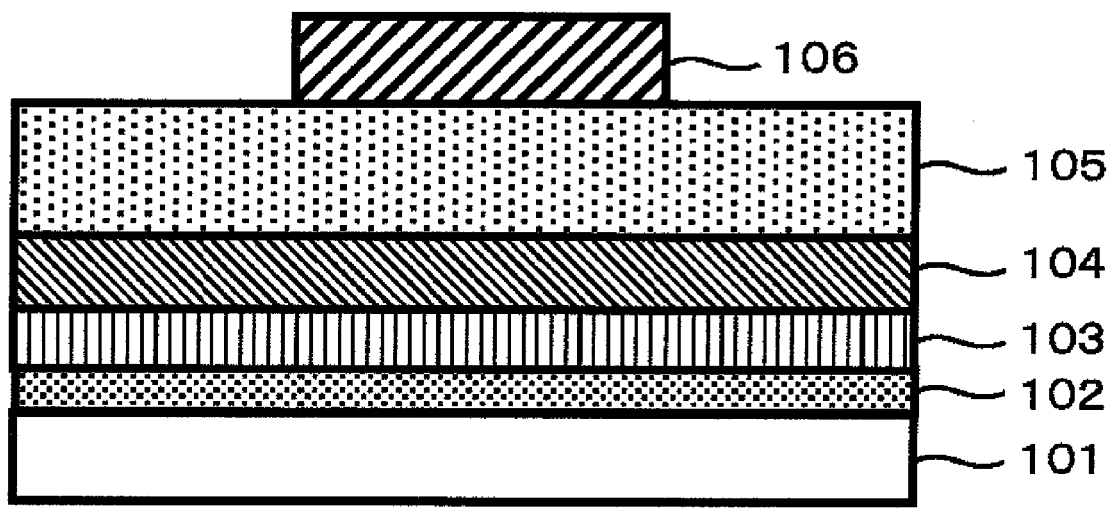
FIG. 1A is a cross-sectional view at the stage in selection of a method of forming a metal/high dielectric gate structure according to the present invention technique.

FIG. 1A is a cross-sectional view of a semiconductor element according to a first present example of the invention. A $SiO_2$ film 102 is formed as a gate insulation film on a semiconductor substrate 101. An $HfO_2$ film 103 is formed as a high dielectric gate insulation film on the $SiO_2$ film 102. A TiN film 104 is formed as a metal film composed of a metallic material on the $HfO_2$ film 103, a polysilicon film 105 is formed on the TiN film 104, and a $SiO_2$ film 106 is formed as a hard mask on the polysilicon film 105. A device pattern is already transferred to the hard mask 106 using an appropriate processing.

First Example

Figure 1B:
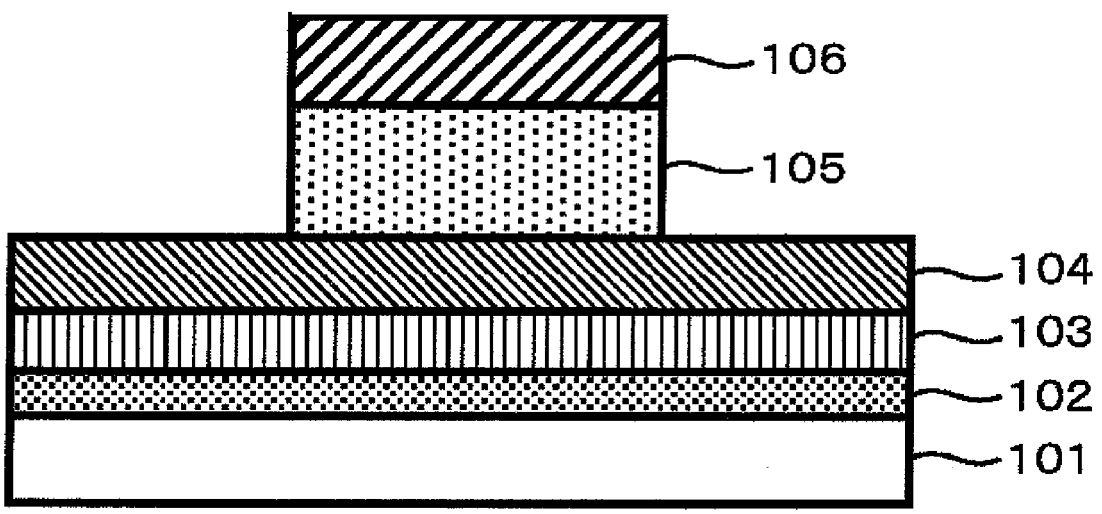
FIG. 1B is a cross-sectional view at the stage in selection of a method of forming a metal/high dielectric gate structure according to the present invention technique.

At first, the polysilicon film 105 is etched under a known condition as illustrated in FIG. 1B. In the etching condition at this time, for example, microwave power is set to 800 W, RF bias power is set to 40 W, a mixed gas of $Cl_2$ with a flow rate of 15 ml/min, $O_2$ with a flow rate of 3 ml/min, and HBr with a flow rate of 45 ml/min is used as an etching gas, a pressure within a processing room is kept at 0.8 Pa, and a wafer temperature is kept at 40° C. This etching condition is one example of the etching condition of the polysilicon film, and the etching condition of the polysilicon film is not limited to the above-described condition. The effect of the present invention is not affected even under any condition.

Figure 1C:
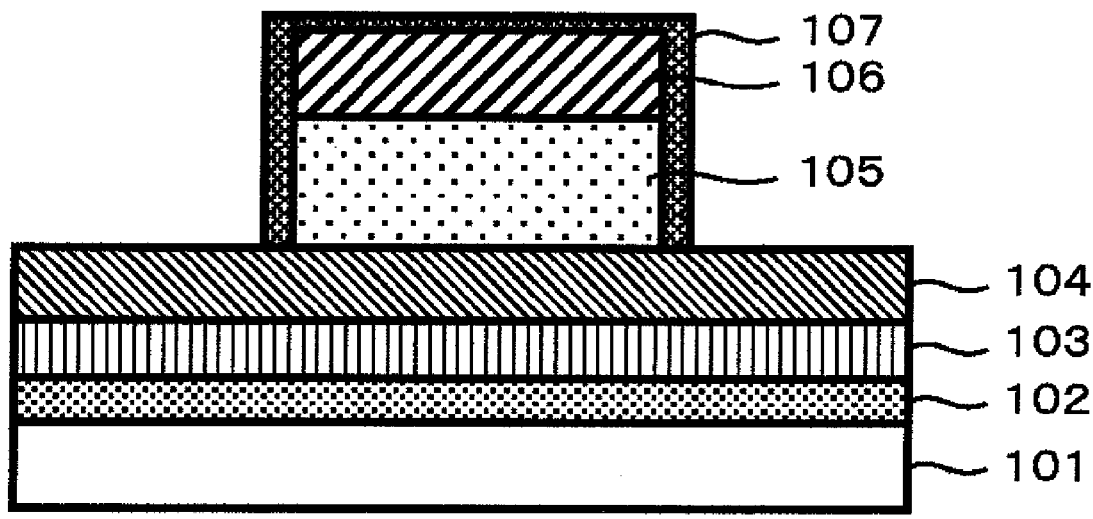
FIG. 1C is a cross-sectional view at the stage in selection of a method of forming a metal/high dielectric gate structure according to the present invention technique.

After the polysilicon film 105 is etched, a protective film 107 made of a carbon polymer is formed on a sidewall of the polysilicon film using plasma comprising $CHF_3$ as illustrated in FIG. 1C. In the etching condition at a stage for forming the protective film of this polysilicon film, for example, the microwave power is set to 1000 W, the RF bias power is set to 30 W, $CHF_3$ with a flow rate of 100 ml/min is used as an etching gas, the pressure within the processing room is kept at 0.3 Pa, and the wafer temperature is kept at 40° C. At this time, owing to a sputter effect of ions vertically drawn into a wafer surface due to an application of the RF bias power, a carbon polymer is hard to be deposited on a surface of the metallic material, and is selectively deposited on a sidewall of the polysilicon film 105.

Figure 2:
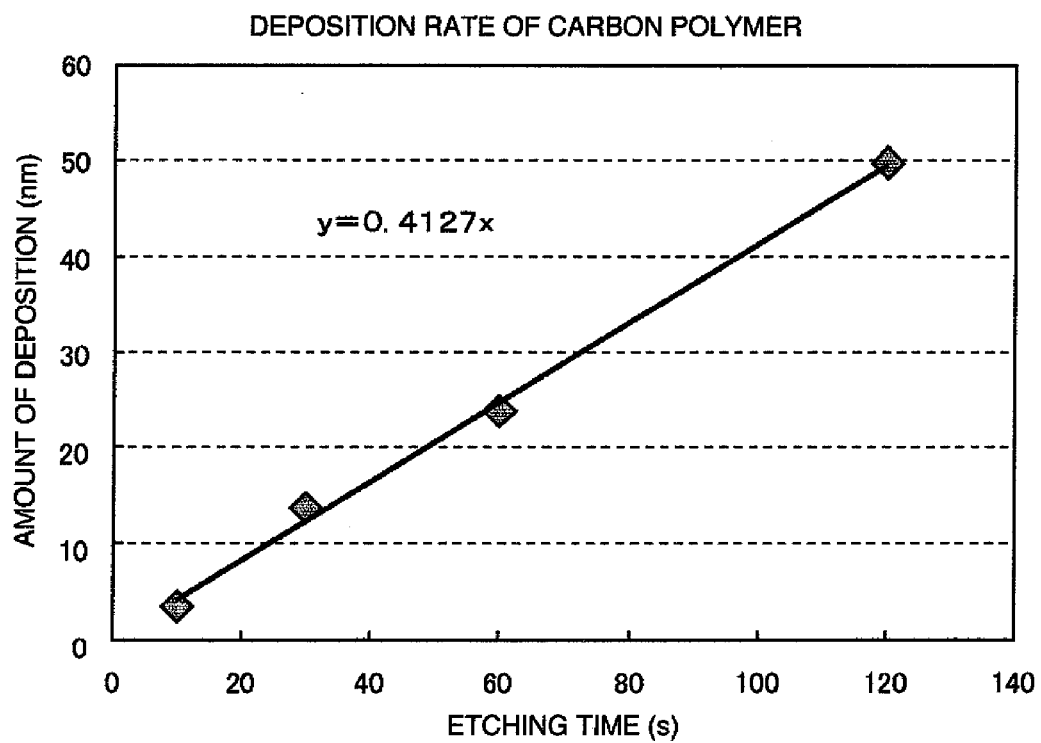
FIG. 2 is a deposition characteristic view of a carbon polymer deposited on a sidewall of polysilicon film according to the present invention technique.

For the purpose measuring a deposition rate of a carbon polymer deposited on the sidewall of the polysilicon film, a silicon wafer in which a device pattern is not formed is etched under this carbon polymer deposition condition, and the amount of deposition of a carbon polymer is measured using a cross-sectional Scanning Electron Microscope. For simulating a change of the sidewall, etching is performed without applying the RF bias power. A result in which the measurement is performed under an etching condition according to the above-described present example is as illustrated in FIG. 2, and the deposition rate is 24.8 nm/min.

Figure 1D:
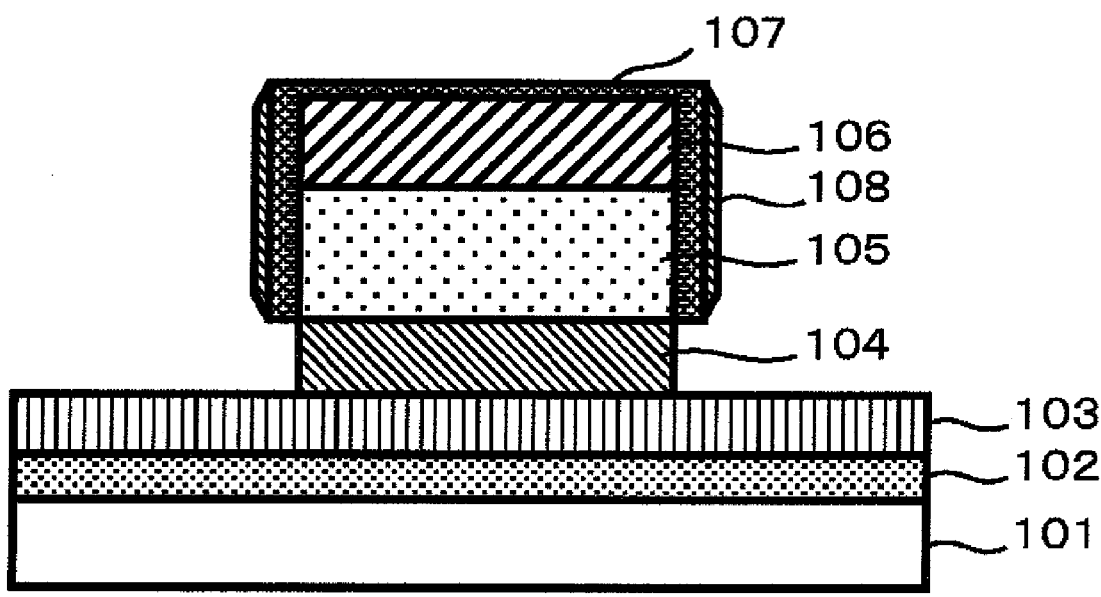
FIG. 1D is a cross-sectional view at the stage in selection of a method of forming a metal/high dielectric gate structure according to the present invention technique.

Thereafter, the TiN film 104 as a lower layer of the polysilicon film 105 is etched as illustrated in FIG. 1D. In the etching condition at this time, for example, the microwave power is set to 800 W, the RF bias power is set to 10 W, $Cl_2$ with a flow rate of 40 ml/min is used as an etching gas, the pressure within the processing room is kept at 0.8 Pa, and the wafer temperature is kept at 40° C. This condition is one example of the etching condition of the TiN film, and the etching condition of the TiN film is not limited to the above-described condition; further, the effect of the present invention is not affected even under any condition.

For the purpose of calculating the etching amount (or etched amount or thickness) of a carbon polymer during the etching on the TiN film 104, a wafer with a resist film in which a device pattern is not formed is etched under the etching condition on the TiN film. On this occasion, for simulating the etching of the carbon polymer generated on the sidewall of the polysilicon film 105, the etching is performed without applying the RF bias power. As a result of the above, the etching amount (thickness) of the resist film is approximately 1.3 nm. Therefore, in the present example, for forming a sidewall protective film of approximately 4 nm, a sidewall protection processing is performed for 10 seconds, thereby generating the protective film made of a carbon polymer. A generation thickness of the protective film made of a carbon polymer can be thus adjusted according to the processing time. The etching amount of the protective film during the etching on the TiN film is different from each other depending on the etching conditions. Accordingly, the etching amount of the resist film is measured under conditions changed at the time of changing the etching condition, and the time of the sidewall protecting step necessary for the measured etching amount is adjusted.

Thereafter, the ashing processing is performed for the purpose of removing the protective film 107 made of a carbon polymer and the TiN 108 scattered and attached to the protective film 107 made of a carbon polymer at the time of etching the TiN film 104. The ashing processing is performed in the ashing processing room within the etching device. In the conditions of the ashing processing, for example, the microwave power is set to 1800 W, $O_2$ with a flow rate of 2000 ml/min is used as an etching gas, the pressure within the processing room is kept at 200 Pa, and the wafer temperature is set at 250° C. The ashing condition is not limited to the above-described condition; further, the effect of the present invention is not affected even under any condition.

In addition, the ashing processing may be directly performed in the etching processing room after the etching processing, or may be performed by another ashing device provided separately from the etching device.

Figure 1E:
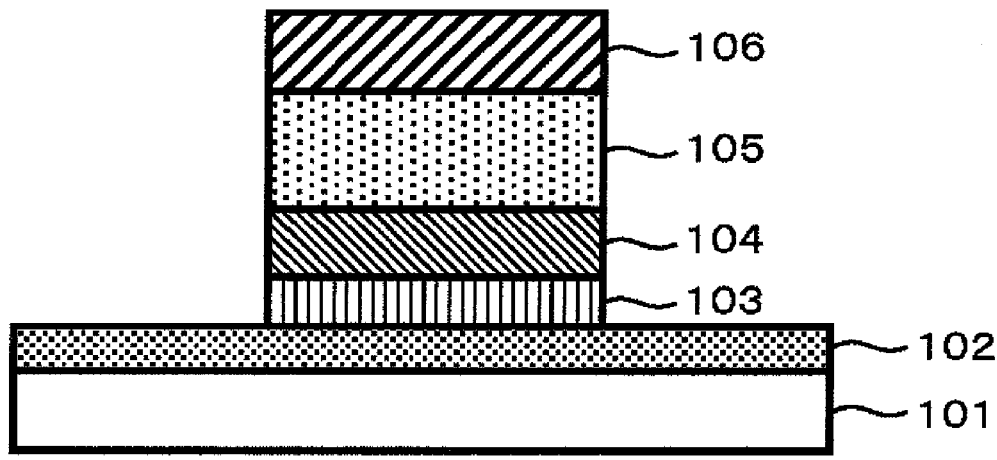
FIG. 1E is a cross-sectional view at the stage in selection of a method of forming a metal/high dielectric gate structure according to the present invention technique.

Further, after the ashing processing, wet etching is performed in a 5% HF aqueous solution for removing by-product materials due to the etching. As a result, there can be obtained a processing shape as illustrated in FIG. 1E, in which unevenness of the sidewall or side etching of the polysilicon film fails to occur.

According to the present example, after etching the polysilicon film, plasma of a gas containing carbons is produced, and the protective film made of a carbon polymer is formed on the sidewall of the polysilicon film. Even if the metallic material as a lower film is etched using plasma containing the halogen gas, this enables the side etching and unevenness of the sidewall of the polysilicon film to be prevented.

When the protective film made of a carbon polymer is formed on a surface of the polysilicon film, the metallic substances scattered at the time of etching the metallic material are attached to a surface of the protective film made of a carbon polymer. Therefore, the metallic substances are not directly attached to the polysilicon film. Accordingly, the metallic substances can be simply removed along with the protective film made of a carbon polymer through the asking process.

In the present example, for forming the protective film 107 made of a carbon polymer, $CHF_3$ is used as a gas containing carbons; however, the gas according to the present invention is not limited to $CHF_3$. Specifically, a gas containing carbons such as $CH_4$, $C_2H_6$, $CH_2F_2$, $CF_4$, $C_4F_8$, $C_3F_6$, $C_3F_8$, $CH_3OH$, and CO can be used in place of $CHF_3$ gas. Further, a mixed gas obtained by mixing two kinds or more gases from among the above-described gases may be used. Further, even if a gas obtained by mixing an addition gas of any one of Ar, He, $O_2$, $N_2$, HBr, and $Cl_2$ with one kind or more gases from among the above-described gases is used, the same effect is obtained.

As to the film structure, a film structure in which two kinds or more metal films as a lower section of the polysilicon film are laminated is also considered; further, a processing method according to the present invention is adaptable also to the above-described structure.

Further, as to the type of a film, in the present example, $SiO_2$ is used as the gate oxide film, $HfO_2$ is used as the high dielectric constant gate insulation film, TiN is used as the metal film, and $SiO_2$ is used as the hard mask, respectively; further, these film types are adaptable, even if using the film type different from that according to the present example. Hereinafter, alternate materials of the above-described films are listed. As to the hard mask, hard mask materials such as SiN, SiON, and SiOC can be used in addition to $SiO_2$. As to the metallic material, in addition to TiN, Ti, Ta, W, La, Mo, Hf, Zr, Nb, V, Ni, Co, Ir, Pt, or Al; a nitride of each of them, or a silicide film of each of them; or a film type obtained by nitriding the silicide film is adaptable.

In the present example, the hard mask is used as a mask for the polysilicon film; further, the present invention is actually adaptable also using a resist mask or masks having other mask structures.

Further, in the present example, ECR is used as a plasma source. Further, the present invention is applicable also to etching using other plasma sources such as ICP and helicon.

The invention claimed is:

1. A dry etching method of a metal/high dielectric gate structure formed on a semiconductor substrate, comprising:
    a step of etching a polysilicon film;
    a step of forming a protective film made of a carbon polymer on a sidewall of the polysilicon film by plasma containing carbons;
    a step of performing an etching process on a metallic material as a lower film of the polysilicon film by plasma containing a halogen gas; and
    an ashing step of removing the protective film made of a carbon polymer along with a scattered metallic material after the etching process.

2. The dry etching method according to claim 1, wherein:
    in a step of forming the protective film made of a carbon polymer, $CHF_3$ with a flow rate of 100 ml/min is used as an etching gas, a pressure within a processing room of an etching device is kept at 0.3 Pa, and a wafer temperature is kept at 40° C.

3. The dry etching method according to claim 1, wherein:
    in a step of forming the protective film made of a carbon polymer, a gas containing at least any one of $CHF_3$, $CH_4$, $C_2H_6$, $CH_2F_2$, $CF_4$, $C_4F_8$, $C_3F_6$, $C_3F_8$, $CH_3OH$, and CO; a mixed gas obtained by mixing two or more gases from among the above-described gases; or a mixed gas obtained by mixing an addition gas of any one of Ar, He, $O_2$, $N_2$, Hbr, and $Cl_2$ with a gas containing at least one gas from among the above-described gases is used as an etching gas.

4. The dry etching method according to claim 1, wherein:
    after the etching process, the ashing step is performed in an ashing processing room within the etching device, or by another ashing device provided separately from the etching device.

* * * * *